United States Patent [19]

Spörer

[11] 4,274,195
[45] Jun. 23, 1981

[54] ASSEMBLY APPARATUS, PARTICULARLY FOR THE ASSEMBLY OF COMPONENTS UPON CARRIER PLATES

[76] Inventor: Bernhard Spörer, Münchener Strasse 12a, D-8011 Faistenhaar, Fed. Rep. of Germany

[21] Appl. No.: 37,116

[22] Filed: May 8, 1979

[30] Foreign Application Priority Data

May 19, 1978 [DE] Fed. Rep. of Germany ....... 2821926

[51] Int. Cl.³ ............................................. H05K 3/30
[52] U.S. Cl. ....................................... 29/741; 29/759; 29/822; 29/832; 211/122; 312/97
[58] Field of Search ................. 29/741, 739, 760, 759, 29/832–841, 822; 269/321 WE

[56] References Cited

U.S. PATENT DOCUMENTS 2,784,045  3/1957  Ormaetxea et al. ................. 312/223

OTHER PUBLICATIONS

Royonic Minl; Brochure furnished by applicant.
Trescomp Paternoster; J. K. Braner & Co.; Brochure furnished by applicant.
Trescomp System; J. K. Braner & Co.; Brochure furnished by applicant.

*Primary Examiner*—Carl E. Hall
*Attorney, Agent, or Firm*—Toren, McGeady and Stanger

[57] ABSTRACT

An assembly apparatus which is particularly useful in the manual assembly of circuit carrier plates with electrical components is formed with an upwardly facing working surface having thereon a support member for the carrier plates, with a plurality of receptacles for holding components to be mounted on the carrier plates being operatively located beneath the working surface. The receptacles are supported for guided movement beneath the working surface through an uppermost and lowermost plane and an opening in the working surface is provided through which an operator seated at the assembly apparatus may grasp components from receptacles located in the upward plane for mounting upon a carrier plate supported on the support member. The supporting means comprise a guide track loop operating to bring the receptacles individually into position within the uppermost plane where they will be accessible through the opening, the guide track loop defining a generally horizontally extending loop axis about which the guide track loop extends, with each receptacle being suspended from the guide track loop in the manner of a pendulum from a pendulum axis extending generally parallel to the loop axis. The superposed planes through which the receptacles are moved are spaced apart a distance such that the working surface may be located at a level which may be conveniently reached by an operator seated at the assembly apparatus while permitting sufficient space for the knees of the operator to extend beneath the receptacles located within the lowermost plane.

20 Claims, 6 Drawing Figures

ASSEMBLY APPARATUS, PARTICULARLY FOR THE ASSEMBLY OF COMPONENTS UPON CARRIER PLATES

BACKGROUND OF THE INVENTION

The invention relates generally to assembly apparatus particularly suitable for use in the manual assembly of circuit carrier plates upon which electrical components must be mounted. The invention is more specifically related to a mounting arrangement whereby receptacles for the components which are to be mounted upon the carrier plates may be located beneath a working surface of the apparatus for operative movement therein.

In assembly apparatus known from the prior art, for example German Utility Model No. 77 12 802, a mounting arrangement of the type referred to above is disclosed wherein a guide track loop of the mounting arrangement is formed of two essentially U-shaped guide track portions each of which are located within one of two superposed planes. The track portions are connected to each other through two transition pieces which are slightly inclined relative to the planes. Due to the fact that receptacles are guided along a guide track loop in two superposed planes, the spacing between a working surface of the apparatus and the knees of an operator sitting in position at the working surface may be efficiently utilized. However, in this known mounting arrangement a disadvantage arises in that the guide track loop must undergo deflections at a total of eight locations thereby requiring an equivalent number of guide devices for the receptacles.

Accordingly, the design of a mounting arrangement of this type tends to be cumbersome and expensive. The large number of guide devices required increases the susceptibility of the mounting arrangement to operating difficulties which are especially likely to occur at the guide devices.

In a further prior art arrangement, known from German Offenlegungsschrift No. 24 31 398, a mounting arrangement having a guide track loop with a horizontal axis is provided with receptacles which are suspended therein in the manner of a pendulum. However, in the case of this prior art, an elongated guide track loop extends essentially vertically behind the edge of a working surface which faces away from an operator. The guide track loop is arched toward the operator above the working surface in order to move the receptacles to a position closer to the operator in order to enable removal of the contents. However, such a position is ergonomically disadvantageous since the operator must reach quite high for removal of such contents.

By contrast to the foregoing, the present invention is intended to provide a mounting arrangement which is simpler in design and which may operate more reliably. For example, the invention is intended to enable an operator to remove components from receptacles in a more convenient manner and in a more comfortable position with the operator's forearms resting upon a working surface which is easily accessible whereby assembly operations which would otherwise require longer time periods may be significantly simplified.

More particularly, the invention is especially directed toward providing an apparatus wherein an operator seated at the apparatus may conveniently reach a working surface of the apparatus while the knees of the operator may be comfortably placed beneath receptacles movably arranged on the underside of the working surface.

SUMMARY OF THE INVENTION

Briefly, the present invention may be defined as assembly apparatus particularly adapted for use in the manual assembly of circuit carrier plates with electrical components comprising means defining an upwardly facing working surface, a support member for said carrier plates on said working surface, a plurality of receptacles for holding components to be used in said manual assembly, means supporting said receptacles for guided movement beneath said working surface through two generally superposed planes, said planes including a lowermost plane and an uppermost plane closest to said working surface, and opening means in said working surface through which an operator seated at said assembly apparatus may grasp components held in said receptacles for mounting thereof upon a carrier plate supported on said support member. The means supporting the receptacles comprise guide track loop means which operate to bring the receptacles individually into position within the uppermost plane where the receptacles may be accessible through the opening means. The guide track loop means define a generally horizontally extending loop axis about which the guide track loop means extend, with each of the receptacles being suspended from said guide track loop means in the manner of a pendulum from a pendulum axis which extends generally parallel to the loop axis. In accordance with the present invention, the supporting means are structured so that the distance between the superposed are structured so that the distance between the superposed planes through which the receptacles are moved in such that the working surface is maintained at a level which may be conveniently reached by an operator seated at the assembly apparatus while permitting sufficient space for the knees of the operator to extend beneath receptacles which are located within the lowermost plane of said two superposed planes.

In accordance with the present invention only two guide devices are necessary in order to impart to the receptacles the capability for moving directly from one plane to the other. Such guide devices may include a pair of spaced guide rollers having an endless chain type of conveyor means extending thereabout. Each of the receptacles may be suspended like a pendulum from the endless chain conveyor means so that each receptacle will maintain its orientation while travelling through the guide track loop means of the invention.

As a result of the overall structural arrangement of the invention, the space beneath the working surface of the mounting device may be utilized to a more efficient extent and as a result the length of each receptacle, taken in a direction parallel to the direction of the loop axis, may be at least three-tenths, and preferably about one-half, of the parallel dimension of the working surface.

In order to simplify the assembly operations which are to be performed with the apparatus, such as, for example, the assembly of circuit carrier plates, it is ergonomically advantageous to arrange the opening through which components are removed in the border region of the working surface which faces toward an operator, that is, between the operator and the location of the carrier plate on the working surface. However, if complicated manipulations must be performed on the carrier plate, such as screwing or attachment of threaded components, it is better to provide the removal opening in the border region of the working surface which faces away from the operator, i.e. with the carrier plate located between the operator and the removal opening. It will be appreciated that operations for mounting threaded members will be more conveniently performed when the carrier plate is located directly in front of the operator.

Particularly in the case of long receptacle members, it is advantageous to arrange the loop axis of the supporting means parallel to the edge of the working surface which faces toward the operator since, in such a case, the receptacles may be moved along their entire length under the removal opening in one of the aforementioned border regions.

It is advantageous to fasten both ends of the receptacles to a flexible endless traction device, for example an endless traction chain, with such traction means being arranged with the spacing of the longitudinal direction of the loop axis. It will be found that traction means of this type will operate reliably.

Due to the fact that the traction means are guided in the region of the edge of the working surface which faces toward the operator through an individual guide roller each in such a manner that the receptacles may reach the axis region between the individual guide rollers, the diameters of the individual guide rollers may be made quite small inasmuch as the receptacles need not be guided around the axes of the individual guide rollers. Accordingly, the space requirement in the vertical direction for the individual guide rollers and for the receptacles which are guided between these individual guide rollers is quite small. Thus, an operator sitting at the working surface will have ample space beneath the individual guide rollers and the receptacles for assuming a a more comfortable position. In the region of the edge of the working surface which faces away from the operator, the traction means may advantageously be guided by means of synchronizing guide rollers which are connected through a synchronizing shaft with the diameter of the synchronizing guide rollers being dimensioned so that the receptacle will travel around the synchronizing shaft. In this manner the two traction means may be arranged to run in a synchronous relationship.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described preferred embodiments of the invention.

DETAILED DESCRIPTION OF THE PREFERRED EMBODIMENTS

Figure 1:
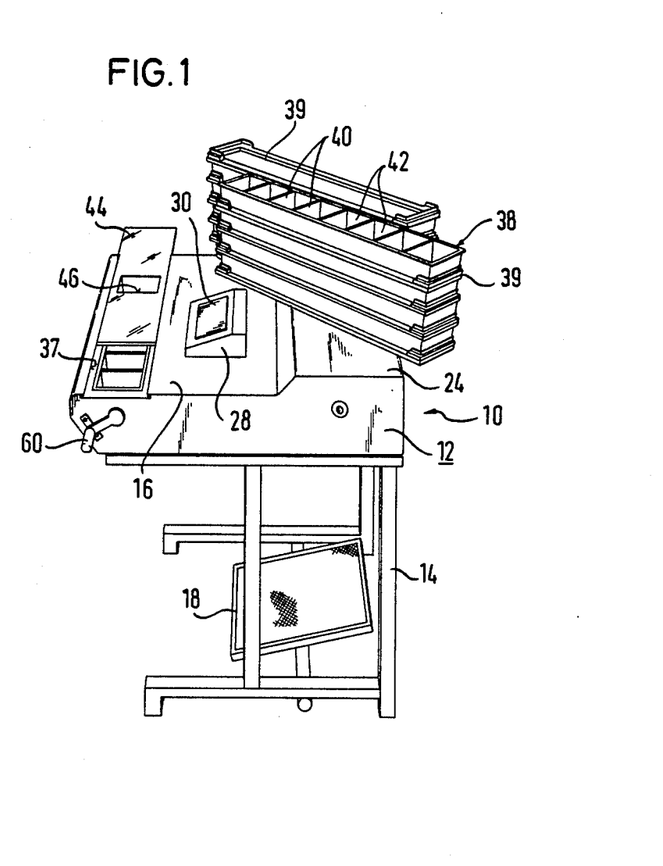
FIG. 1 is a perspective view of a first embodiment of an assembly apparatus in accordance with the invention shown with stacked containers.
Figure 2:
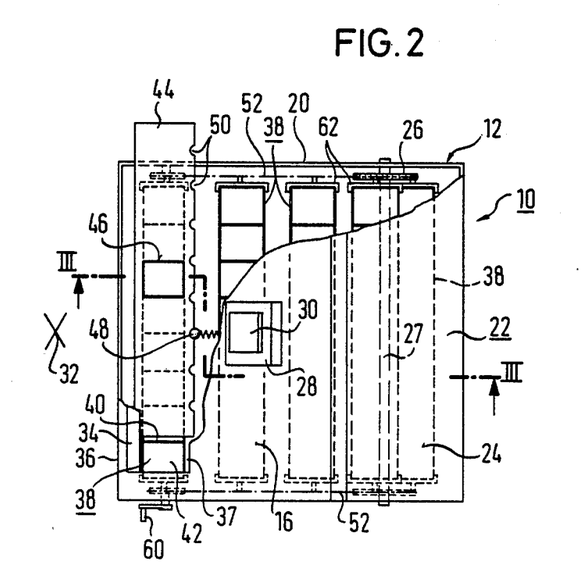
FIG. 2 is a top view of the mounting arrangement according to FIG. 1 shown with partially broken-away sheet metal coverings.
Figure 3:
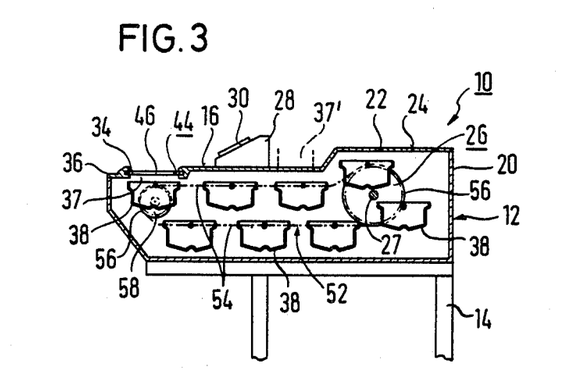
FIG. 3 is a side view of the mounting arrangement according to FIGS. 1 and 2 taken as a sectional view along the line III—III of FIG. 2.

Referring now to the drawings wherein similar reference numerals are used to identify like parts throughout the various figures thereof, and with specific reference to FIGS. 1–3 wherein a first embodiment of an assembly apparatus in accordance with the present invention is depicted, it will be noted that the assembly apparatus is generally identified by the reference numeral 10. The assembly apparatus consists essentially of a component supply structure 12 which is supported upon a support structure 14. The component supply structure 12 is provided with a relatively large upper surface which constitutes a working surface 16 of the assembly apparatus. The working surface 16 is located at a normal working level convenient for an operator seated adjacent the apparatus 10.

A foot rest 18 is arranged at the bottom of the support structure 14. Because of the rather small structural height of the component supply structure 12 in the region of the working surface 16, which height may be less than 20 centimeters, a separate support structure 14 is not required and the component supply structure 12 may be placed on an existing work table. The component supply structure 12 consists of a housing 20 formed of sheet metal with a sheet metal cover 22 which extends over the housing 20 on the upper side thereof and which, as shown in FIG. 2, is partially broken away so that the arrangement of the interior of the component supply structure 12 may be more clearly seen. The cover sheet 22 includes a region 24 which is raised relative to the working surface 16 in order to provide room within the housing 20 for synchronizing guide rollers 26 which shall be discussed in more detail hereinafter (see FIG. 3).

Mounted upon the working surface 16 is a support 28 which may be used to hold a carrier plate 30 to be assembled. The carrier plate 30 is fastened to the support by means which are not illustrated. In FIG. 2, a seat 32 for an operator is symbolically shown by a cross and it will be apparent that an operator seated at the location 32 may perform manual assembly procedures as may be required. A border region 34 of the working surface 16 faces toward the operator and is provided with an opening 37 which extends along the edge 36 of the working surface 16. The opening 37 enables removal of components from within the component supply structure 12, in a manner to be more fully explained hereinafter.

Beneath the removal opening 37 there is provided one of eight receptacles or containers 38 which, by means of a chain drive which is to be more fully explained hereinafter, may be moved successively beneath the opening 37 so that components for assembling the carrier plate 30 may be removed from the container or receptacles 38. Accordingly, the opening 37 corresponds in size essentially to the horizontal perimeter of the containers 38.

Under ordinary circumstances, the assembly of the carrier plates with the components indicated will usually require in excess of a eight different types of components. Therefore, the receptacles 38 are divided into eight individual compartments 42 by means of removable separating walls 40 best seen in FIG. 1. The different types of components are placed into the individual compartments 42 in a sequence which corresponds to the sequence of the manual assembly operations which are to be performed. To assure that the sequence is inevitably followed during removal of the components, the removal opening 37 is provided with a sliding cover shield 44 which, in its central position, covers the removal opening 37 with the exception of a shield opening 46 located in the middle of the cover shield 44. When the cover shield 44 is moved out of its central position, a portion of the removal opening 37 is exposed at one end of the cover shield 44 (see FIG. 2). However, there is little danger that during the manual assembly procedure components will be removed from this exposed portion of the removal opening 37 instead of from the shield opening 46, since both opening 37 and 46 differ significantly with respect to their visual appearance. The cover shield 44 may be made of sheet material or of plexiglas.

The receptacles 38 are fastened at both their ends to two endless chains 52 which form two loops with a joint horizontal loop axis, i.e. they are located opposite each other in two parallel vertical planes. The two chain loops have the same general configuration so that, when the chains 22 are moved synchronously with each other, the containers 38 will move along a guide track loop which corresponds to the chain loops. The loop axis extends parallel to the edge 36. Each chain loop is characterized by two vertically superposed straight loop portions 54 which are connected by two loop portions 56 which are approximately annularly shaped.

The circular loop portions 56 located in the vicinity of the edge 36 are each guided around individual guide rollers 58 in such a way that the receptacles 38 may reach into the axis region between the individual guide rollers 56. On the other hand, the circular loop portions 56 which are located remote from the edge 36 are guided through the aforementioned synchronizing guide rollers 26 which are connected to each other through a synchronizing shaft 26. To prevent the receptacle 38 from abutting into the synchronizing shaft 27, the size of the diameter of the synchronizing guide rollers is appropriately selected.

The lower straight loop portion 54 extends tangentially into the two circular loop portions 56. The upper straight loop portion 54, on the other hand, extends tangentially to the loop portion 56 which is guided around the individual guide roller 58, while the loop portion 56 which is guided around the synchronizing guide roller 26 extends upwardly from the upper straight loop portion 54. In order to obtain a loop of this shape, the chain 52 is guided between the synchronizing guider roller 26 and the individual guide roller along a corresponding guide trail or guide roller which is not shown in FIGS. 1–3. These guide rails or guide rollers absorb a portion of the weight of the containers 38.

FIG. 2 symbolically illustrates a locking device which is formed by a spring-loaded ball 48 and complementary indentations 50 formed in one of the edges of the cover shield 44 and shaped to engage with the ball 48. By means of this locking device, the cover shield 44 can be locked in various removal positions which correspond to the divisions of the compartments of the receptacles 38. The locking device is disengaged by moving the cover shield 44 and, when moved, it will perceptibly engage above the next compartment 42. In order to prevent the receptacles 38 from tilting about their longitudinal axes which are parallel to the loop axes as they travel along the guide track loop and, thus, to prevent the components within the receptacles from being inadvertently discharged therefrom, each receptacle 38 is suspended upon the chains 52 in the manner of a pendulum.

Since the movement of the two chains 52 is positively synchronized by means of the synchronizing guide rollers 26, it is necessary that only one of the two chains 52 be driven. For this purpose, a crank 60 shown in FIG. 2 is provided which drives the individual crank rollers 58 either directly or through intermediate gearing. The gear ratio may be advantageously selected in such a manner that the next adjacent receptacle 38 will be beneath the opening 37 after one rotation of the crank 60.

The containers may be easily removed and replaced since it is merely necessary that they be hung in the holding members 62 which are rigidly connected to the chains 52. When replacement of the receptacles is required, the cover shield 44 is removed from the mounting arrangement 10 and the receptacles 38 may be successively removed and then again hung in position. The receptacles 38 may be stacked and they therefore require only a relatively small area for storage. In FIG. 1, the eight receptacles 38 which are required for a complete equipment inventory of the assembly apparatus 10 are stacked upon the apparatus as indicated. In order to increase the stability of the stacks, the receptacles 38 are provided with covers 39 which will provide a support base for a receptacle 38 stacked above a lower receptacle with the cover.

At the commencement of an assembly procedure of a carrier plate 30, the receptacle 38 which contains the components required for the commencement of the assembly procedure is first moved under the removal opening 37 by turning the crank 16. The cover shield 44 is then moved into a predetermined initial position which may, for example, be a location where the shield opening 46 is above the compartment 42 at the left end of the container 38. After removal of the required component or components from the compartment 42, the cover shield 44 is moved to the right until it engages the next compartment 42. Subsequent components may then be drawn from this compartment 42.

In this manner, the cover shield 44 is moved toward the right in a step-wise manner until the shield opening 46 is located above the compartment 42 which is at the right end of the receptacle 38.

After removal of the appropriate component or components from this compartment 42, the cover shield 44 is again moved toward the left into its initial position and, by rotation of the crank 60, a next receptacle 38 is moved beneath the removal opening 37 and the components may be then successively removed from their compartments 42 in a manner similar to that described above.

Assembly errors which might result from removal of components from a wrong component 42 may be easily eliminated since the operator, after a short training period, will almost automatically shift the cover 44 by the width of a compartment after each component removal.

When assembly operations involving more complicated mechanical manipulations, such as screwing operations, must be performed, it is usually desirable to arrange the carrier plate as close as possible to the vicinity of the operator and preferably in the edge region 34. Operations involving threaded members may be performed when an operator has access from directly above the point of operation. In order to enable the operator to manipulate the components with a convenient reach, a removal opening 37' may be provided in the edge region of the working surface 16 which faces away from the operator (shown in broken line in FIG. 3). In most cases, a cover shield 44 is then not required since the components, in contrast to electrical components for circuit carrier plates, may easily be distinguished more clearly because of their outer appearance.

Figure 4:
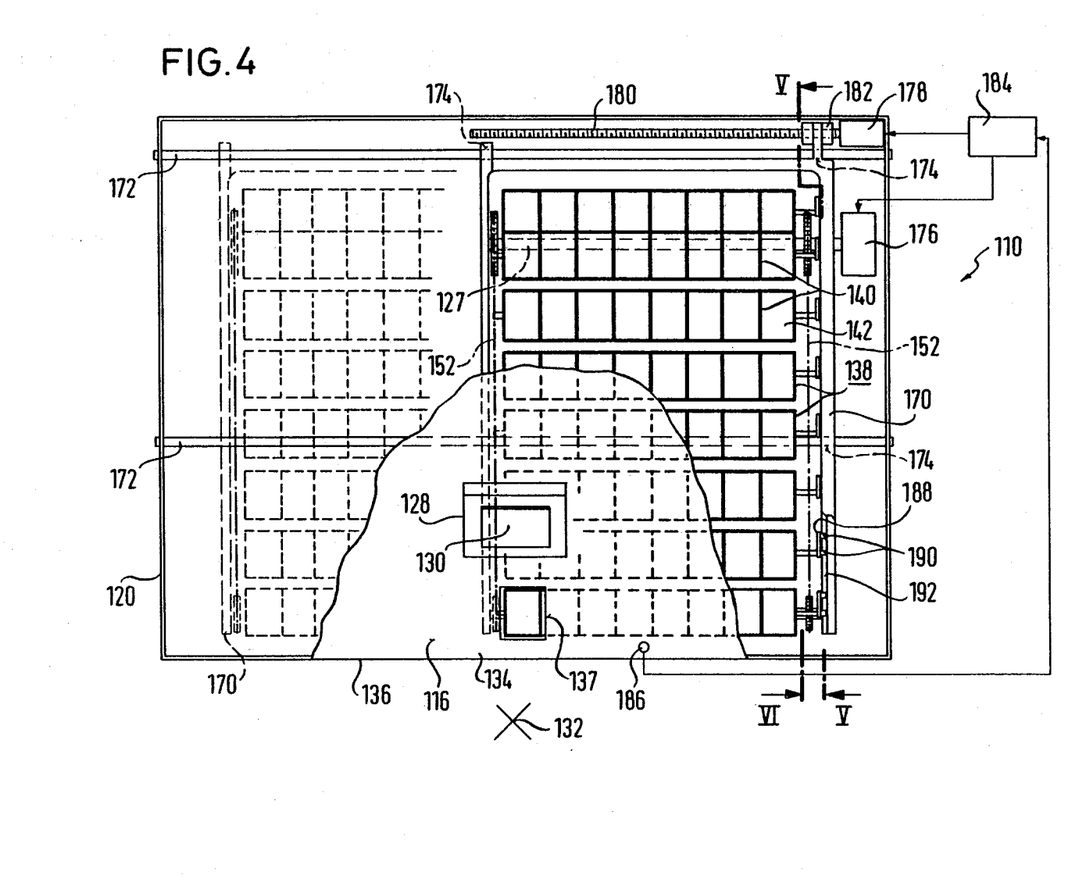
FIG. 4 is a top view of a second embodiment of an assembly apparatus in accordance with the invention shown with partially broken-away sheet metal coverings.
Figure 5:
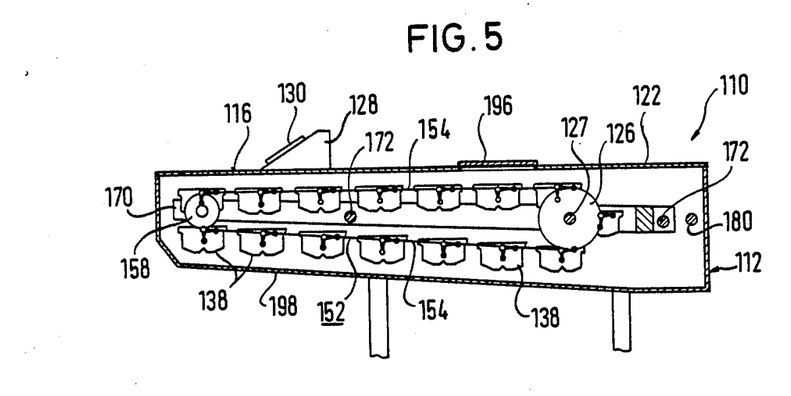
FIG. 5 is a side view showing the mounting arrangement according to FIG. 4 taken in a sectional view along the line V—V.
Figure 6:
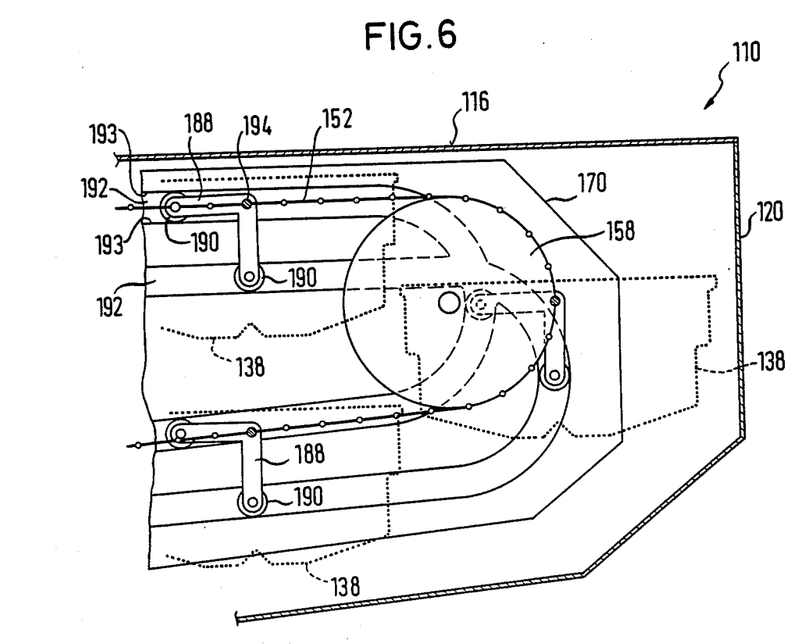
FIG. 6 is a sectional view taken in the direction of the arrow VI—VI of FIG. 4 (mirror inverted) showing a more detailed view of the mounting arrangement of FIGS. 4 and 5.

A second embodiment of an assembly apparatus in accordance with the invention is shown in FIGS. 4–6 and identified by the reference numeral 110. Parts of this second embodiment which correspond or are similar to parts of the first embodiment are identified by similar reference numerals raised by 100.

Additionally, in the case of the second embodiment, the removal opening 137 is arranged between the carrier plate 130, which is fastened to the support 128, and an operator who may sit at the seat 132 in front of the assembly apparatus 110. That is, the opening is in the border region 134 of the working surface 116. However, the size of the removal opening 137 merely corresponds to the size of a compartment 142 of the receptacles 138. In order to enable components to be successively removed from the compartments 142, individual guide rollers 158 and the synchronizing guide rollers 126 are supported in a carriage 170 which may be moved in a carriage guide extending parallel to the edge 136 of the working surface 116 which faces toward the operator. This carriage guide is schematically illustrated with the aid of a pair of guide bars 172 which pass through corresponding bores 174 in the carriage 170. However, the carriage guide may also be embodied differently, for example, by guide wheels operating in engagement with rails.

In FIG. 4, an end position of the carriage 170 is shown in solid line form. In this end position, the removal opening 137 is located above the compartment 142 at the left end of the receptacle 138. The opposite end position of the carriage 170 is shown in broken line form and in this position the removal opening is located above the compartment 142 at the right end of the receptacle 138. The carriage 170 may be moved between these two end positions in steps which correspond to the divisions of the different compartments.

The chains 152 are driven by a first motor drive 176 which drives a synchronizing shaft 127. The carriage 170 is shifted between its two end positions by means of a second motor drive 178 which drives a spindle 180, with a spindle nut 182 being rigidly connected to the carriage 170 and arranged on the spindle 180.

The two motor drives 176 and 178 are connected to a position control system 184 which controls the two drives. The position control system 184 is connected to an actuating element which may be, for example, a push button 186. When the operator requires new components, he may actuate the push button 186, whereupon the position control system 184 provides control signals to the drives 176, 178 for positioning a new compartment 142 beneath the removal opening 137. The utilization of a position control system 184 which may be programmed and which may, for example, include a microprocessor, results in the possibility of operation wherein any compartment 142 of any receptacle 138 may be successively moved beneath the removal opening 137 in accordance with a stored program. With standard filling of the receptacles 138 with components suitable for use with several different carrier plates 130, the assembly apparatus 110 may be easily adjusted from assembly of one type of carrier plate to an assembly procedure of another type of carrier plate in a simple manner merely by changing the program of the position control system 184. This means that a significant simplification may be effected as compared with other systems which may require exchange of an entire set of receptacles 138 in the assembly apparatus 110.

The position control system 184 may also be connected to a control system for an assembly location indication. In such an assembly location indication, an optical signal may be generated on the carrier plate, for example, on illuminated points at the assembly location.

When the chains are driven to start and stop suddenly, a tilting moment will act on the receptacles 138. A tilting moment will also act when the receptacles are moved around the synchronizing guide rollers 126 and the individual guide rollers 158. In order to prevent the receptacles 138 from tilting, the receptacles are rigidly connected at both ends to angles 188 to which there are connected guide elements 190 which travel in guide tracks 192 within the carriage 170. In order to simplify the illustration in the drawings, the angles 188, the guide elements 190 and the guide tracks 192 are shown merely on the right side of the frame 70. The front portion of the frame 170 on the right side is shown partially broken away.

In FIG. 6, the receptacles 138 which are located above the plane of the drawing are shown in dotted lines. The angles 188 are non-rotatably connected to the receptacles 138 through connecting bolts 194 which are fastened to the chains 152. The guide elements 190 which are constructed as rollers are fastened to the ends of each angle 188. The guide elements 190, in turn, travel in grooved guide tracks 192 which are cut into the inner side surface of the frame 70.

By using two guide elements 190 it is possible to prevent the receptacles 138 from tilting during circulation even in the case of large tilting moments. In the straight loop portions 154 of the chain loop drive, the guide element 190 which is staggered in the horizontal direction relative to the connecting bolt 194 primarily ensures that the receptacles 138 do not tilt, since this guide element 190 moves perpendicularly relative to its guide track 192 during tilting movement and immediately abuts the upper or the lower surface of its guide track 192 or the upper or lower guide surface 193. Accordingly, the guide element 190, which is staggered in the vertical direction relative to the connecting bolt 194, particularly prevents the receptacle 138 from tilting when the latter moves in a vertical direction along its circular path around the guide rollers 126 or 158. In the remaining portions of the circular path, the two guide elements 190 will cooperate between the guide rollers 126 and 158, the downwardly offset guide element 190 absorbs the weight of the receptacle 138 so that guide rails or guide rollers supporting the chain 152 are necessary.

Since the containers 138 are guided so as to be secured against tilting, the drive velocity of the chains 152 may be significantly increased. The upper limit of their velocity is determined solely by the force of gravity, since the receptacles 138 cannot be moved downwardly with an acceleration which is larger than the acceleration due to gravity which would cause the components contained therein to be displaced therefrom. In the apparatus 110 shown in FIGS. 4-6, a circulation time for the receptacles 138 of about 1.5 seconds is achieved. Inasmuch as the movement of the carriage 170 from its leftmost position to its rightmost position, and vice versa, requires less than 1.5 seconds, within this time any compartment 142 may be moved beneath the removal opening 137. Accordingly, assembly of a carrier plate may be performed without delay because of extended conveying periods.

The chain loop of the assembly apparatus 110 is longer than the loop of the assembly apparatus 10, so that a larger number of receptacles 138, i.e. fifteen receptacles, can be arranged between the chains 152. Since each receptacle 138 has eight compartments 142, a sufficient number of different components will be available even where extensive assembly operations must be performed.

Unlike the assembly apparatus 10, the sheet metal cover 122 of the housing 112 in the assembly apparatus 110 is entirely flat and has a flap 196 for removing and exchanging the receptacles 138, as seen in FIG. 5.

The chain loop of the assembly apparatus 110 also has a somewhat different shape. Chain 152 is tightly stretched to facilitate rapid acceleration. The synchronizing guide roller 126 is then downwardly offset in such a way that the upper straight loop portion extends horizontally while the lower straight loop portion 154 is inclined downwardly in a direction toward the synchronizing guide roller 126. Since the distance between the individual guide roller 158 and the synchronizing guide roller 126 is relatively large, the inclination of the lower loop portion 154 and of the sheet metal bottom 198 of the housing 120 which is parallel to the loop portion 154 is small and thus, again in this case, there will be sufficient space for the knees of the operator beneath the equipment.

It should also be noted that in the arrangements described, the receptacles are moved through a pair of superposed generally horizontally extending planes, with the uppermost plane being closer to the working surface of the apparatus.

While specific embodiments of the invention have been shown and described in detail to illustrate the application of the inventive principles, it will be understood that the invention may be embodied otherwise without departing from such principles.

What is claimed is:

1. Assembly apparatus particularly for use in the manual assembly of components upon carrier plates comprising: means defining a working surface having removal opening means formed therethrough through which said components may be grasped by an operator; receptacle means including individual discrete receptacles located beneath said working surface and accessible to an operator through said removal opening means; closed loop support means having said receptacle means mounted thereon for moving said receptacle means through a closed loop path in first generally parallel opposed directions relative to said working surface; guide frame means having said closed loop support means operatively associated therewith and movable relative thereto for moving said receptacle means relative to said working surface in second generally parallel opposed directions perpendicular to said first directions; said closed loop support means and said guide frame means cooperating to enable said receptacle means to be driven to selectively bring said discrete receptacles individually into operative alignment with said removal opening means to enable components contained therein to be removed by an operator.

2. Assembly apparatus particularly for use in the manual assembly of carrier plates with components, comprising:
  (a) stationary means defining an upwardly facing working surface, and comprising a removal opening formed through said working surface in a position fixed during operation with respect to said working surface;
  (b) a guiding frame;
  (c) a plurality of elongated component receiving means having axes of elongation parallel to each other and extending in a generally horizontal direction, said component receiving means being subdivided in compartments along the respective axis of elongation, said compartments having an access opening to be aligned with said removal opening, said component receiving means being guided on said guiding frame along a closed loop having a loop axis parallel to said axes of elongation, said loop being substantially tangential with respect to the lower side of said working surface at the location of said removal opening;
  (d) first motor driving means for moving said component receiving means along said loop with respect to said guiding frame;
  (e) second motor driving means for moving said guiding frame along said loop axis with respect to said working surface; and
  (f) control means for said first and second motor driving means for simultaneously moving said component receiving means along said loop and said guiding frame along said loop axis to place a preselected compartment in alignment with said removal opening in the shortest possible time.

3. Assembly apparatus according to claim 2, wherein said closed loop comprises an essentially U-shaped loop section with an upper leg nearest to said working surface and extending parallel to said working surface and with a lower leg, said legs being spaced apart a distance such that the working surface may be located at a level which may be conveniently reached by an operator seated at the assembly apparatus while permitting sufficient space for the knees of the operator to extend beneath the component receiving means located in said lower leg of said loop.

4. Apparatus according to claim 2 wherein said component receiving means comprise a plurality of receptacles and wherein each of said receptacles has a length dimension extending in the direction of said loop axis of at least 30 centimeters.

5. Apparatus according to claim 4 wherein said length of said receptacle is greater than 50 centimeters.

6. An assembly according to claim 2 wherein said working surface includes an edge located to be adjacent an operator seated at said apparatus and wherein said loop axis extends parallel to said edge.

7. Apparatus according to claim 2 wherein said removal opening is located in a border region of said working surface adjacent an operator seated at said apparatus.

8. Apparatus according to claim 2 wherein said removal opening is located on said working surface in a region thereof facing away from an operator seated at said apparatus.

9. Apparatus according to claim 2 wherein said component receiving means comprise receptacles constructed as elongated unitary members each divided into a plurality of separate individual compartments.

10. Apparatus according to claim 2 wherein said component receiving means comprise receptacles formed as a plurality of individual containers arranged adjacent each other in the direction of said loop axis.

11. Apparatus according to claim 2 wherein said component receiving means are guided along said closed loop by a pair of flexible endless traction devices which are spaced apart in the longitudinal direction of said loop axis and comprise receptacles arranged with the ends thereof, respectively, fastened to one of said traction means.

12. Apparatus according to claim 11 wherein said working surface includes a front region located adjacent an operator seated at said assembly apparatus and a back region located more remote from said operator, said apparatus further comprising guide rollers located adjacent said front region and engaging said traction means in such a manner as to guide said receptacles in a region between said guide rollers, said apparatus also comprising synchronizing guide rollers and a synchronizing shaft extending therebetween which are located in the vicinity of said back region for guiding said receptacles for movement in the area of said back region, the diameter of said synchronizing guide rollers being dimensioned such that said receptacles may travel around said synchronizing shaft without interference therefrom.

13. An assembly according to claims 11 or 12 further comprising guide track means, said receptacles including at at least one end thereof at least one guide element which engages said guide track means to secure said receptacles against tilting thereof when said receptacles are moved through the deflection regions of their path of travel by said guide track loop means.

14. Apparatus according to claim 13 wherein each of said receptacles have at at least one end thereof a pair of guide elements rigidly connected thereto which are offset in the vertical and longitudinal directions of said guide track means and which travel in said guide track means, said guide track means being correspondingly offset relative to each other.

15. Apparatus according to claim 2 wherein said component receiving means comprise a plurality of receptacles and wherein said removal opening extends through said working surface across a distance equivalent to the length of each of said receptacles in the direction of said loop axis, said apparatus further comprising a cover shield partially covering said removal opening, said cover shield being slidable in the direction of said loop axis.

16. Apparatus according to claim 15 further comprising locking means for engaging said cover shield and operating to releasably hold said cover shield in a plurality of positions each enabling removal of components from within a respective receptacle.

17. Apparatus according to claim 1 wherein said opening means include a removal opening formed to extend through said working surface and extending across a distance equivalent to the length of each of said receptacles in the direction of said loop axis, said opening means further comprising a cover shield partially covering said removal opening, said cover shield being slidable in the direction of said loop axis.

18. A mesh distribution wheel for seine lines having a plurality of meshes of quadrilateral shape comprising
a drive shaft;
a pair of wheel portions mounted on said drive shaft at a definite distance from each other; and
a plurality of pins circumferentially spaced about each wheel portion in a radiating saw-tooth manner at a center-line to center-line spacing corresponding to a predetermined degree of insertion of the meshes, each said pin having a foot portion for receiving a quadrilaterally shaped mesh of a seine thereabout and for engaging at least two corners of the mesh.

19. Apparatus according to claim 2 wherein said second motor driving means comprise a spindle drive.

20. Apparatus according to claim 2 wherein said control means comprise a position control system operative to emit control signals to said first and said second motor driving means in accordance with a selected desired position for said component receiving means.

* * * * *